United States Patent
Wang et al.

(10) Patent No.: US 10,797,687 B2
(45) Date of Patent: Oct. 6, 2020

(54) SIGNAL DUTY CYCLE ADAPTIVE-ADJUSTMENT CIRCUIT AND METHOD FOR RECEIVING TERMINAL

(71) Applicant: INTERNATIONAL GREEN CHIP (TIANJIN) CO., LTD, Binhai New Area, Tianjin (CN)

(72) Inventors: Junning Wang, Tianjin (CN); Jianhui Lin, Tianjin (CN)

(73) Assignee: INTERNATIONAL GREEN CHIP (TIANJIN) CO., LTD, Tianjin (CN)

( * ) Notice: Subject to any disclaimer, the term of this patent is extended or adjusted under 35 U.S.C. 154(b) by 172 days.

(21) Appl. No.: 16/075,257

(22) PCT Filed: Nov. 24, 2017

(86) PCT No.: PCT/CN2017/112775
§ 371 (c)(1),
(2) Date: Aug. 3, 2018

(87) PCT Pub. No.: WO2019/085091
PCT Pub. Date: May 9, 2019

(65) Prior Publication Data
US 2020/0162065 A1 May 21, 2020

(30) Foreign Application Priority Data
Nov. 2, 2017 (CN) .......................... 2017 1 1066460

(51) Int. Cl.
*H03K 5/156* (2006.01)
*G06F 13/40* (2006.01)
(Continued)

(52) U.S. Cl.
CPC ....... *H03K 5/1565* (2013.01); *G06F 13/4072* (2013.01); *G06F 13/4282* (2013.01);
(Continued)

(58) Field of Classification Search
CPC ............. G06F 13/4072; G06F 13/4282; G06F 13/4295; G06F 2213/0042; H03K 5/1565; H03M 1/0626; H03M 1/1014; H03M 5/12
(Continued)

(56) References Cited

U.S. PATENT DOCUMENTS

2004/0075462 A1* 4/2004 Kizer ................... H03K 5/1565
326/29

* cited by examiner

*Primary Examiner* — William Hernandez
(74) *Attorney, Agent, or Firm* — Birch, Stewart, Kolasch & Birch, LLP

(57) ABSTRACT

The present invention relates to a signal duty cycle adaptive-adjustment circuit and method for a receiving terminal. In one embodiment, the circuit includes an analog level comparison circuit, a preprocessing circuit, a first path switch, a second path switch, a decoding circuit, a parameter extraction and estimation circuit, an error generation circuit, a filter feedback circuit and a digital-to-analog conversion circuit. The analog level comparison circuit receives a valid signal according to a reference level to generate a duty cycle signal. The preprocessing circuit preprocesses the duty cycle signal. When the first path switch is turned on, the parameter extraction and estimation circuit acquires duty cycle information from the duty cycle signal to generate a duty cycle deviation. The error generation circuit processes the duty cycle deviation to generate an error signal. The filter feedback circuit and the digital-to-analog conversion circuit filter the error signal and then convert the error signal into an analog voltage signal, which is connected to the analog level comparison circuit to serve as a reference level. When the second path switch is turned on, the decoding circuit decodes the duty cycle signal.

7 Claims, 3 Drawing Sheets

FIG. 2

(51) Int. Cl.
*G06F 13/42* (2006.01)
*H03M 1/06* (2006.01)
*H03M 5/12* (2006.01)
*H03M 1/10* (2006.01)

(52) U.S. Cl.
CPC ....... *H03M 1/0626* (2013.01); *H03M 1/1014* (2013.01); *H03M 5/12* (2013.01); *G06F 2213/0042* (2013.01)

(58) Field of Classification Search
USPC .................................................. 327/175
See application file for complete search history.

SIGNAL DUTY CYCLE ADAPTIVE-ADJUSTMENT CIRCUIT AND METHOD FOR RECEIVING TERMINAL

BACKGROUND OF THE INVENTION

Technical Field

The present invention relates to adaptive-adjustment circuits and methods, in particular to a signal duty cycle adaptive-adjustment circuit and method for a receiving terminal.

Description of Related Art

Universal Serial Bus (USB) interfaces were initially designed mainly for data transmission and data exchange and have an extremely limited power supply capacity. However, along with the development of electronic technology, USB has started to play a very different role, and the power supply capacity of the interfaces has become as important as data transmission. For instance, handheld devices, intelligent wearable devices, portable devices, tablet computers and so on are generally able to obtain power via USB interfaces.

Nowadays, USB has been used as a standard interface for various electronic devices, the power supply capacity of the USB interfaces has been upgraded to 5V@1.5 A in version 2.0 from 5V@500 mA in version 1.0, and thus, the power supply requirements of many electronic products can be met. However, there are still many high-power electronic devices such as notebook computers, televisions and display screens, which need a supply power of tens of watts or over, which cannot obtain sufficient operating power via existing USB interfaces.

The lately-issued USB Power Delivery (PD) protocol has improved the power supply capacity of the USB interfaces to a new level based on USB version 3.1, namely a new power delivery concept put forward for USB type-C interfaces. Thanks to the high-power characteristics of USB type-C interfaces, USB can realize rapid charging at a power as high as 100 W so as to supply power to larger electric devices such as notebook computers, large-screen monitors, and flat panel televisions. Moreover, by popularizing USB Type-C interfaces to replace the power supply interfaces of electronic devices, the electronic devices can have a high integration level and a lower cost, and meanwhile, various power supply adapters and power transmission lines are shared to reduce resource waste. At present, the USB PD protocol supports various voltage and current configurations, such as a step unit as small as 50 mV or 10 mA and a power output as high as 100 W (20V/5 A).

As for USB Type-C interfaces, a Configuration Channel (CC) channel, which is defined by the USB PD power supply specification, is used for USB PD communication. Based on the half-duplex communication mechanism, 4B/5B-coded binary data is transmitted by means of Bi-phase Mark Coding (BMC), and this method has been issued as a standard and is being gradually and widely used and popularized by reason of its simplicity, flexibility, and a design capable of simplifying receivers.

BMC can be regarded as Manchester coding, which is designed so that a clock and data are contained in a data stream to enable a clock synchronizing signal to be transmitted to the opposite side while code information is transmitted, and that each bit of coding involves at least one jump and is free of direct-current components, and thus, BMC has a self-synchronizing capacity and a good anti-disturbance capacity. The receiving party extracts the synchronizing signal from a special code containing the synchronizing signal so as to lock the self clock pulse frequency, thus realizing synchronization. However, due to the fact that each code element is modulated into two levels, the data transmission rate is only half of the modulation rate.

In actual application, due to the variable qualities of transmitting terminals, inconsistent qualities of transmission media, different lengths of channels, severe external disturbances on signals and hash environments, the receiving terminal may encounter many problems such as large direct-current biases and inter-code disturbances, which will have a great influence on received BMC signals, consequentially resulting in severe waveform distortion. Here, the following several factors are mainly summarized:

1. Large frequency deviations between the transmitting terminal and the receiving terminal: due to the fact that the transmitting terminal and the receiving terminal are generally located in different systems, clock sources of the transmitting terminal and the receiving terminal are different, and the large frequency deviations are objectively unavoidable and may lead to inconsistent sending and receiving criteria with respect to the reference Unit Interval (UI), thus, resulting in error codes.

2. Large local direct-current deviations during conversion from an analog quantity to a digital quantity of the receiving terminal: BMC has no intrinsic direct-current component, but if the direct-current biases of the receiving terminal are superimposed on a received BMC waveform, these direct-current biases may cause noise even louder than that of a front-end receiving circuit, and consequentially, the signal to noise ratio is increased, and the waveform duty cycle is severely distorted after a received BMC signal is converted into a digital quantity, resulting in BMC decoding failures.

3. Inconsistent level conversion rates: the rate of switching signals to a high level from a low level is inconsistent or mismatched with the rate of switching the signals to a low level from a high level, which may also indirectly result in distortion of the BMC waveform duty cycle. Many push-pull output stages in certain modes of modern operational amplifiers are asymmetric, and the conversion rate in a certain direction tends to be greater than that in other directions.

4. Non-ideal factors such as clock jitters, additive channel noise, and inter-code disturbances may also result in distortion of the BMC waveform duty cycle.

In engineering practice, in order solve the problems of channel noise or disturbances, FIR filters are usually used to filter out undesired signals from desired signals. This is very effective for waveform distortion caused by random non-ideal factors such as clock jitters, additive channel noise, and inter-code disturbances, but it is ineffective for waveform distortion caused by intrinsic direct-current biases of analog level comparators and transmitting and receiving frequency deviations of systems.

In view of this, a BMC discrimination and waveform automatic-adjustment circuit is necessary for the receiving circuit to adjust the BMC duty cycle waveform distorted by the possible intrinsic factors mentioned above, so that the duty cycle of a received BMC signal is made within a certain decodable range, and the conversion of the received signal from an analog quantity to a digital quantity is properly judged to complete correct BMC decoding. Generally, the performance of the receiving circuit in the process of conversion from the analog quantity to the digital quantity plays a decisive role in the overall performance and communication error rate of a receiver. Physical layer decoding based on BMC decoding is closely related to the waveform duty cycle, and thus, under the premise of meeting the basic functional requirements, duty cycle adjustment circuits have to be actually debugged to obtain good performance. If this process is not handled properly, designed circuits may have extremely poor receiving performance or environment adaptability.

BRIEF SUMMARY OF THE INVENTION

To fulfill the above objective, the present invention provides a signal duty cycle adaptive-adjustment circuit for a receiving terminal. The signal duty cycle adaptive-adjustment circuit includes an analog level comparison circuit, a first path switch SW-M, a second path switch SW-N, a decoding circuit, a parameter extraction and estimation circuit, an error generation circuit, a filter feedback circuit and a digital-to-analog conversion circuit. The analog level comparison circuit is used for receiving a signal and comparing the received signal with a reference level to generate a duty cycle signal. The first path switch SW-M and the second path switch SW-N are both duty cycle signal transmission path switches. When the duty cycle signal is a preamble, the first path switch SW-M is turned on, and the duty cycle signal is connected to the parameter extraction and estimation circuit; otherwise, the second path switch SW-N is turned on, and the duty cycle signal is connected to the decoding circuit. The decoding circuit is used for decoding the duty cycle signal. The parameter extraction and estimation circuit is used for acquiring duty cycle information from the duty cycle signal to generate a duty cycle deviation. The error generation circuit is used for processing the duty cycle deviation to generate an error signal. The filter feedback circuit is used for converting the error signal into an error control quantity and outputting the error control quantity to the digital-to-analog conversion circuit. The digital-to-analog conversion circuit is used for converting the error control quantity into an analog signal from a digital signal and outputting the analog signal to a reference level terminal of the analog level comparison circuit.

Preferably, the signal duty cycle adaptive-adjustment circuit further includes a preprocessing circuit used for preprocessing the duty cycle signal.

Preferably, the filter feedback circuit includes a feedback filter used for filtering high-frequency components out of the error signal to generate the error control quantity through linear computation.

Preferably, the signal duty cycle adaptive-adjustment circuit further includes a sequential control circuit used for controlling the whole working process of the signal duty cycle adaptive-adjustment circuit for a receiving terminal.

Preferably, the signal duty cycle adaptive-adjustment circuit further includes a received signal activity indicating circuit used for detecting an input signal; and if an input signal with valid features is detected, the sequential control circuit is informed, a receiving system is enabled, and a receiving circuit starts to work.

Preferably, the duty cycle of the duty cycle signal passing through the second path switch SW-N ranges from 35% to 65%, and the allowable deviation is +/−5%.

Preferably, the preprocessing circuit is used for preprocessing the duty cycle signal to determine whether or not the duty cycle signal is within a certain spectral range and to eliminate noise.

Preferably, the duty cycle signal is a ratio of a high-level width of a signal waveform to a whole bit cycle and has a value ranging from 0% to 100%.

Preferably, the parameter extraction and estimation circuit is a circuit used for acquiring high-level bit duty cycle information from the duty cycle signal.

The present invention further provides a signal duty cycle adaptive-adjustment method for a receiving terminal. The method includes: Step 602, the first path switch SW-M is turned off, and the second path switch SW-N is also turned off; Step 603, the received signal activity indicating circuit detects whether or not a valid input signal is input; if not, Step 602 is performed; Step 604, the first path switch SW-M is turned on, the second path switch SW-N is turned off and the number of times Nstep is initialized to 1; Step 605, a duty cycle parameter is extracted and estimated to obtain a duty cycle deviation, and an error signal is obtained through error computation; Step 606, the error signal is input into a filter feedback unit to be filtered, an output voltage of a digital-to-analog converter is adjusted to serve as a reference voltage, and the analog level comparison circuit outputs a subsequent waveform under a new reference voltage, and the number of times Nstep is increased by 1; Step 607, whether or not the number of times Nstep is equal to 8 or a waveform duty cycle is close to an expected value is judged, namely whether or not an output duty cycle error signal is smaller than a preset threshold is judged; if the condition is not met, Step 605 is performed; Step 608, the first path switch SW-M is turned off and the second path switch SW-N is turned on; and Step 609, an adjusted signal is input into the decoding circuit, and then subsequent valid data starts to be received and processed, and after the process is completed, Step 603 is performed.

According to the circuit and method in the embodiments of the present invention, adaptive-adjustment is carried out in the preamble sequence stage of a USB PD message packet to adjust and recover a severely-distorted waveform duty cycle, which is mainly reflected in that when the analog level comparison circuit has a large direct-current bias or the transmitting terminal has an inconsistent voltage conversion rate, the duty cycle automatic-adjustment circuit can eliminate the influences caused by the large direct-current bias or the inconsistent voltage conversion rate to remarkably improve a distorted waveform, and thus, a reliable waveform source is output for the subsequent decoding circuit. Meanwhile, neither extra calibration time nor calibration format pre-customization is needed, and thus, seamless connection with the USB PD protocol is achieved. Adaptive-adjustment is carried every time a data packet is received according to specific characteristics of receiving circuits, and thus, the circuit and method have a wide adaptability.

DETAILED DESCRIPTION OF THE INVENTION

The technical scheme of the present invention is further described in detail as follows in combination with the drawings and embodiments.

Bi-phase Mark Coding (BMC) is taken as an example in the present invention, but is not used to limit the protection scope of the present invention.

Figure 1:
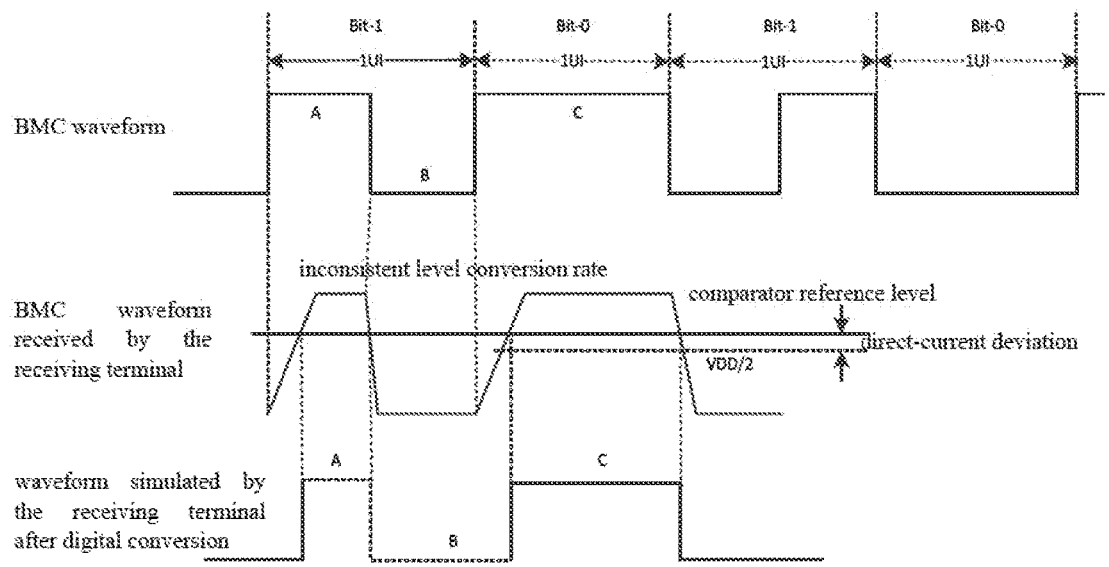
FIG. 1 shows the definition of BMC and an BMC waveform diagram recovered from a receiving terminal in the prior art.

FIG. 1 shows the definition of BMC and a BMC waveform diagram recovered from a receiving terminal in the prior art.

As for the definition of BMC. Bit-1 defines that one time of level switching occurs at the start of each UI and a second time of level switching occurs in the middle of each UI, and that a high level and a low level each have a duty cycle of 50%; and bit-0 defines that one time of level switching occurs only at the start of each UI.

When an analog quantity is converted into a digital quantity, the receiving terminal has an inconsistent level conversion rate, and an analog level converter has a large positive direct-current deviation, resulting in severe distortion of a BMC digital waveform received after conversion. As shown in FIG. 1, the lower waveform has two obvious problems: duty cycle distortion of Bit-1 is severe, and width A is obviously smaller than width B; and the width of a low-level section B of Bit-1 is almost close to the width of a following high-level section C of Bit-0.

If this distorted waveform is directly input into a BMC decoding circuit, the decoding circuit cannot figure out Bit-1 or determine whether section B is the low-level section of Bit-1 or the low-level section of Bit-0 by comparing width of A with width of B, and consequentially. BMC decoding fails, and effective communication cannot be achieved.

Figure 2:
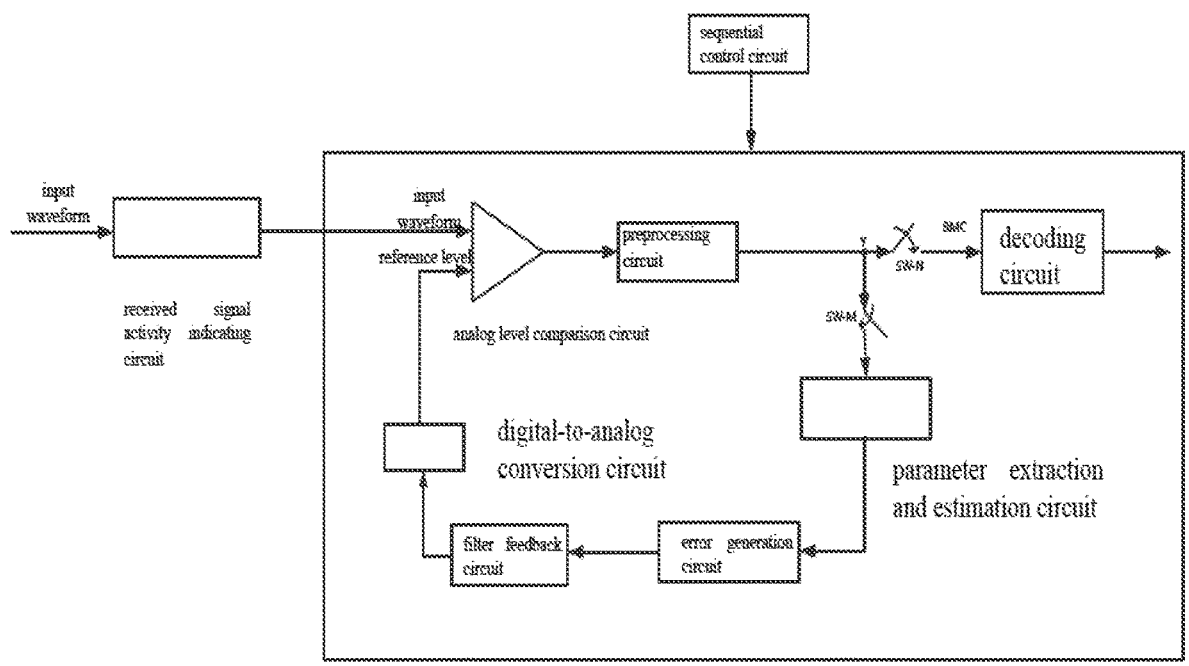
FIG. 2 is a structural view of a signal duty cycle adaptive-adjustment circuit for a receiving terminal in one embodiment of the present invention.

FIG. 2 is a structural view of a signal duty cycle adaptive-adjustment for a receiving terminal in one embodiment of the present invention.

As shown in FIG. 2, the circuit includes an analog level comparison circuit, a preprocessing circuit, a first path switch SW-M, a second path switch SW-N, a decoding circuit, a parameter extraction and estimation circuit, an error generation circuit, a filter feedback circuit and a digital-to-analog conversion circuit.

The analog level comparison circuit is used for receiving a valid signal and a reference level and comparing an input signal with a feedback reference level to convert a BMC waveform into a digital quantity from an analog quantity and to recover a modulated BMC signal to generate a duty cycle signal.

The preprocessing circuit completes digital sampling of the BMC signal output by the analog level comparison circuit through an internal receiving clock and is used for preprocessing the duty cycle signal (namely for sampling and preprocessing the recovered BMC waveform) to judge whether or not the BMC signal is a valid BMC signal and to eliminate the influence of noise.

The first path switch SW-M and the second path switch SW-N are both duty cycle signal transmission path switches. When the duty cycle signal is a preamble, the first path switch SW-M is turned on, and the duty cycle signal is connected to the parameter extraction and estimation circuit; otherwise, the second path circuit SW-N is turned on, and the duty cycle signal is connected to the decoding path.

The decoding circuit is used for decoding the duty cycle signal.

The parameter extraction and estimation circuit is used for extracting valid duty cycle information from the duty cycle signal to generate a duty cycle deviation.

The error generation circuit is used for processing the duty cycle deviation and comparing the duty cycle information with an ideal duty cycle parameter to generate an error signal, namely a duty cycle error component.

The filter feedback circuit includes a feedback filter used for digitally filtering the duty cycle error component so as to convert the duty cycle error component into an error control quantity.

The digital-to-analog conversion circuit is used for converting the error control quantity into an analog voltage signal connected to the analog level comparison circuit.

The received signal activity indicating circuit is an input signal monitoring circuit and is used for detecting the input signal. The received signal activity indicating circuit detects a CC channel all the time and instructs the sequential control circuit to send out an indication of the reception of a valid input signal when detecting an input signal with valid features, and afterwards, a receiving circuit is enabled to start to work normally.

The sequential control circuit controls and enables the adaptive-adjustment circuit, control the time sequence of functional modules such as extraction and estimation, error quantity generation, feedback to complete specific control over the switch SW-M and the switch SW-N. Namely, the sequential control circuit is used for controlling the working process of the whole system to complete duty cycle adaptive-adjustment and to enable or disable the normal receiving function. In this embodiment of the present invention, the signal duty cycle adaptive-adjustment circuit carries out adaptive-adjustment in a preamble sequence time window of a USB PD message packet, namely during duty cycle adaptive-adjustment, the switch SW-M is turned on, and the switch SW-N is turned off. After adaptive-adjustment is completed by the signal duty cycle adaptive-adjustment circuit, the switch SW-M is turned off, and the switch SW-N is turnedon. When the received signal activity indicating circuit indicates the absence of a valid input signal, both the switch SW-M and the switch SW-N can be turned off to reduce overall power consumption.

As shown in FIG. 2, all the circuit modules mentioned above are combined to form a negative feedback loop for automatic adjustment of the BMC duty cycle. As the parameter extraction and estimation circuit is generally nonlinear, the negative feedback control loop is usually a nonlinear feedback system.

The received signal activity indicating circuit is used for monitoring the input signal of the receiving terminal and detects signal changes on the CC channel in real time. When detecting a feather signal within a certain frequency range, the received signal activity indicating circuit sends out an indication of the reception of a valid input signal, afterwards, the receiving system is enabled, and the receiving circuit starts to work. As the adaptive algorithm is extremely sensitive to errors and abnormalities of input signals, the adaptive algorithm will be severely worsened and cannot be recovered under certain circumstances if an abnormal input waveform enters the feedback system. In view of this, in one embodiment of the present invention, it is set that only when the received signal activity indicating circuit monitors an input signal with valid features is the duty cycle adaptive-adjustment algorithm enabled to work; in other conditions, the whole adaptive feedback loop does not operate and is kept in a low power consumption mode.

Figure 3:
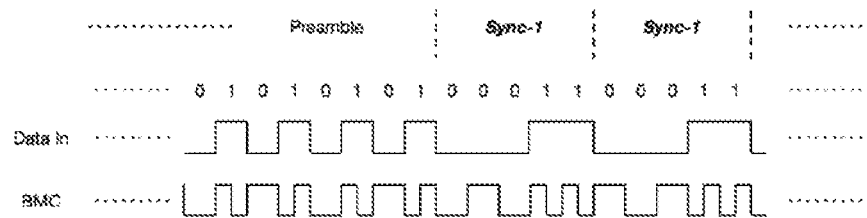
FIG. 3 is a diagram of a communication message packet in one embodiment of the present invention.

FIG. 3 shows part of the illustrative information of the USB PD message packet. Particularly, Preamble refers to a preamble sequence sent when a physical layer is connected to the channel, and the preamble sequence is used for synchronizing the clock of a receiver of a destination host with the clock of a transmitter of a source host. In the USB PD protocol, the preamble is defined as a "0-1-0-1" alternating code, wherein 0 is the start and 1 is the end. Valid information follows after the preamble sequence. In FIG. 3, "00011" and "00011" are frame start boundary characters and used for indicating the start of the valid information.

When the received signal activity indicating circuit monitors an input signal with valid features, the duty cycle adaptive-adjustment algorithm is enabled to work. The analog level comparison circuit takes a received analog waveform as an input and takes an output of the digital-to-analog conversion circuit as a reference level. If the level of the input signal is greater than the reference level, a high level 1 is output; otherwise, a low level 0 is output. The analog level comparison circuit converts the BMC waveform into a digital quantity from an analog quantity, and thus, a modulated BMC signal is recovered.

Figure 4A:
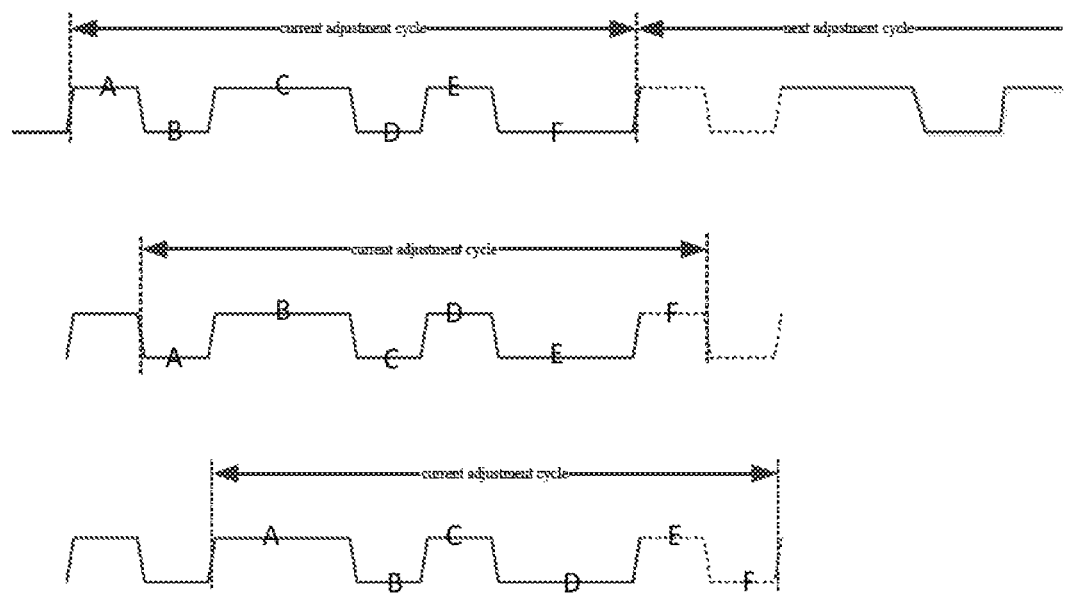
FIG. 4a is a waveform diagram for extracting a duty cycle error in one embodiment of the present invention.

FIG. 4a is a waveform diagram for extracting a duty cycle error in one embodiment of the present invention.

The parameter extraction and estimation circuit extracts a valid duty cycle parameter from the BMC signal output by the preprocessing circuit and figures out an adjustment proportion, and in this case, it is generally necessary to know the influence factors of different parameter estimation methods to the input signal duty cycle. In one embodiment of the present invention, the automatic duty cycle parameter is mainly used for tracking the slow variation tendency of the high-level width and the low-level width of a Bit-0 signal, namely the low-frequency component. The preamble sequence code in USB PD communication is a "0-1-0-1" alternating code, and this time period is called a time window for BMC waveform duty cycle adaptive-adjustment. Namely, in this time window, the switch SW-M of the circuit is turned on to make the feedback loop work, and the switch SW-N is turned off to prevent data from being input into the BMC decoding circuit.

In FIG. 4a, according to level changes of each input waveform, the received waveform can be divided into six stages respectively marked as A-B-C-D-E-F. The BMC waveform is periodic in the preamble sequence stage, and the six stages form a feedback and refresh cycle. The marked initial position of the six stages is random, which means that any one of the six stages may be marked as A, and this is associated with the marked actual start time of the circuit, but the result of the algorithm will not be affected.

The six stages definitely include the high level section of Bit-0 as well as the low-level section of Bit-0.

Figure 4B:
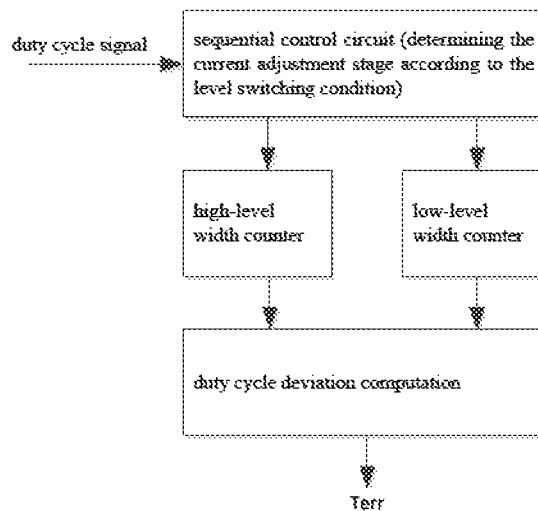
FIG. 4b is a diagram of a parameter extraction and estimation circuit of the present invention.

FIG. 4b is a diagram of the parameter extraction and estimation circuit.

A specific description of the algorithm for extracting, estimating and obtaining a duty cycle adjustment parameter is as follows:

The sequential control circuit determines that the current level is a preamble and the current stage is an adjustment stage according to level switching. In one embodiment, two counters are adopted, wherein a high-level width counter is used for figuring out the maximum high-level width in the six stages, and the count value is set as TH; and a low-level width counter is used for figuring out the maximum low-level width, and the count value is set as TL.

Then the BMC duty cycle deviation of Bit-1 is calculated and represented by the result obtained by subtracting TL from TH, a linear relation between the result and the BMC duty cycle deviation is defined, and a scale factor is marked as λ:

$$Terr=\lambda(TH-TL)$$

The value of λ depends on the capacity of the digital-to-analog conversion circuit, the conversion rate of the analog level conversion circuit and the resolution ratio of high-low level width counting. Counting and computation modes of the counters can be realized through a logic gate circuit or through a CPU program.

In the error generation circuit, the duty cycle deviation Terr obtained through computation is subjected to subtraction with an expected duty cycle deviation to obtain a duty cycle error component, namely an error signal.

Figure 5:
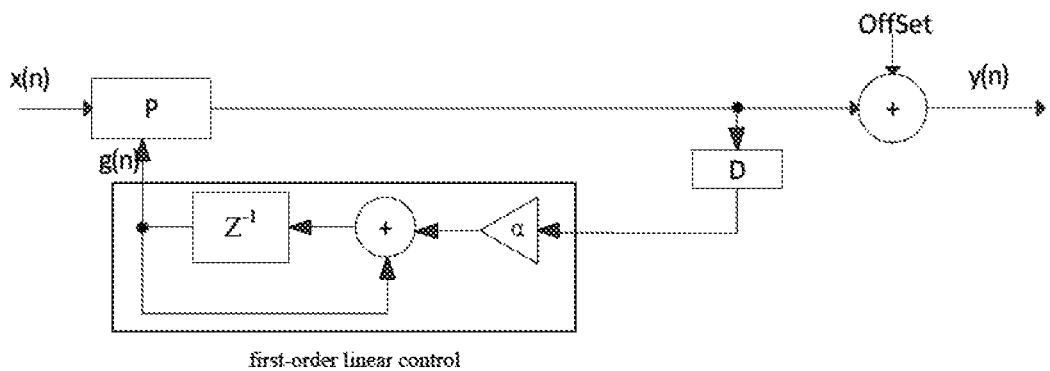
FIG. 5 is a structural view of a filter feedback circuit.

FIG. 5 shows a structural view of the filter feedback circuit.

The filter feedback circuit includes a feedback filter. In order to achieve better filtering, a first-order liner feedback filter is adopted in this embodiment of the present invention. It is noteworthy that the present invention is not limited to the first-order linear feedback filter. The first-order linear feedback filter filters out the high-frequency component, namely an instant component, in the error component according to the duty cycle error component. A proportional channel and an integral channel of the filter feedback circuit are linearly combined to form an error control quantity.

The model structure of the first-order linear feedback filter is shown in FIG. 5. In the drive circuit, a first-order infinite impulse response filter is formed by an adder, a multiplier and a D flip-flop and can filter out the high-frequency component in the input signal. Wherein, P is gain control module and is a monotone increasing function of g(n). An output signal is formed by linear combination of the proportional channel and the integral channel. The proportional channel is obtained by multiplying input x(n) by a coefficient, and input g(n) is the integral channel. When g(n)>0, y=P(g)*x, wherein D is a parameter estimation module and is generally realized by an accumulator or a low pass filter. In actual work, the algorithm has the properties of the first-order IIR low pass filter.

In the first-order infinite impulse response filter, the input signal is multiplied by a firstly through the multiplier and then added with a signal value stored by the D flip-flop through the accumulator, the signal value obtained after accumulation is stored in the D flip-flop and then output, and the output signal value is g(n).

After linear combination of the proportional channel and the integral channel, a deviation value OffSet is obtained through accumulation by the accumulator, and thus, an error control quantity y(n) is obtained.

By analyzing the feedback loop with P(g)=g, D(y)=|y| as an example, a linear updating equation obtained is as follows:

$$g(n+1)=g(n)[1-\alpha|x(n)|]$$

Suppose x(n)=cu(n), wherein c is a constant and refers to an amplitude value, u(n) is a step function, a steady state response solved is as follows:

$$g(n)[1-(1-\alpha c)^n]u(n)$$

The convergence condition of the system is |1−αc|<1, namely 0<αc<2. Thus,

When αc<1, the system is in an overdamping state;
When αc>1, the system is in an underdamping state;
When αc=1, the system is in a critical damping state.

After the system model is applied to the whole feedback loop, when the input error signal is large, the adjustment slope is large, and the convergence speed is high; and when the input error signal is attenuated, convergence of the system can be achieved in a longer time.

Figure 6:
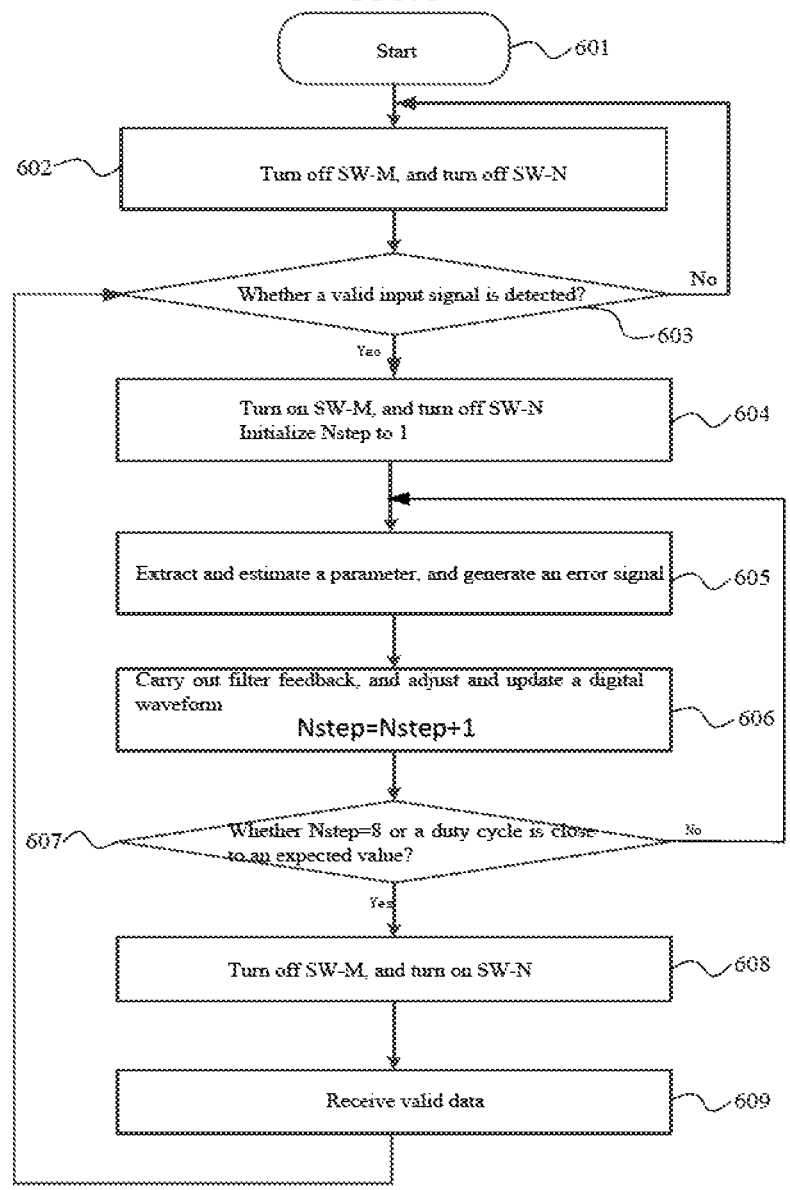
FIG. 6 is a flow diagram of a signal duty cycle adaptive-adjustment method for a receiving terminal in one embodiment of the present invention.

FIG. 6 is a flow chart of a signal duty cycle adaptive-adjustment method for a receiving terminal in one embodiment of the present invention. The method includes:

Step 602, the first path switch SW-M is turned off, and the second path circuit SW-N is turned off;

Step 603, whether or not a valid signal input is detected by the received signal activity indicating circuit; if not, Step 602 is performed;

Step 604, the first path switch SW-M is turned on, the second path switch SW-N is turned off, and the number of times Nstep is initialized to 1;

Step 605, a duty cycle parameter is extracted and estimated to obtain a duty cycle deviation, and an error signal is obtained through error computation;

Step 606, the error signal is input into the filter feedback unit to be filtered, an output voltage of the digital-to-analog converter is adjusted to serve as a reference voltage, the analog level comparison circuit outputs a subsequent waveform under a new reference voltage, and the number of times Nstep is increased by 1;

Step 607, whether or not the number of times Nstep is equal to 8 or a waveform duty cycle is close to an expected value is judged, namely whether or not an output duty cycle error signal is smaller than a preset threshold is judged; if the condition is not met, Step 605 is performed;

Step 608, the first path switch SW-M is turned off, and the second path switch SW-N is turned on:

Step 609, an adjusted signal is input into the decoding circuit, and then subsequent valid data starts to be received and processed; and after the process is completed, Step 603 is performed.

In Step 608, after the first path switch SW-M is turned off the circuit still works, but the input signal of the negative feedback loop is 0. As the last adjustment record is maintained in the filter feedback circuit, even if the first path switch SW-M is turned off, an adjusted reference level still can be output into the analog level comparison circuit to adjust the BMC waveform.

In Step 609, the adjusted signal is input into the decoding circuit, and then the subsequent valid data starts to be received and processed. Preferably, if the signal duty cycle ranges from 35% to 65%, it is regarded that correct decoding can be achieved by the decoding circuit. For different circuits, the allowable variation amplitude range of the signal duty cycle for correct decoding is +/−5%.

Terms for representing electrical connection such as "connection", "connected" and "connect" indicate direct or indirect electrical connection without special explanation. "Column" or "row" in the present invention has a general meaning and can refer to a horizontal line or a vertical line in an array.

The BMC duty cycle adaptive-adjustment circuit structure for a receiving terminal in the embodiment of the present invention is particularly used for USB PD communication receivers, and is applicable, but not limited, to USB PD systems.

The objective, technical scheme and beneficial effects of the present invention are further described in detail in combination with the specific embodiments mentioned above. It should be understood that the above embodiments are only specific embodiments of the present invention and are not used to limit the protection scope of the present invention. Any modifications, equivalent substitutes, and improvements based on the spirit and principle of the present invention should fall within the protection scope of the present invention.

What is claimed is:

1. A signal duty cycle adaptive-adjustment circuit for a receiving terminal, characterized by including an analog level comparison circuit, a first path switch (SW-M), a second path switch (SW-N), a decoding circuit, a parameter extraction and estimation circuit, an error generation circuit, a filter feedback circuit and a digital-to-analog conversion circuit, wherein:

the analog level comparison circuit is used for receiving an input signal to generate a duty cycle signal based on the received input signal and a reference level;

the first path switch (SW-M) and the second path switch (SW-N) are both duty cycle signal transmission path switches; when the received signal is a preamble, the first path switch (SW-M) is turned on, and the duty cycle signal is connected to the parameter extraction and estimation circuit; otherwise, the second path switch (SW-N) is turned on, and the duty cycle signal is connected to the decoding circuit;

the decoding circuit is used for decoding the duty cycle signal;

the parameter extraction and estimation circuit is used for acquiring duty cycle information from the duty cycle signal to generate a duty cycle deviation;

the error generation circuit is used for processing the duty cycle deviation to generate an error signal;

the filter feedback circuit is used for converting the error signal into an error control quantity; and the digital-to-analog conversion circuit is used for converting the error control quantity into an analog signal and outputting the analog signal obtained after conversion to a reference level terminal of the analog level comparison circuit to serve as the reference level.

2. The circuit according to claim 1, wherein the circuit further includes a preprocessing circuit used for preprocessing the duty cycle signal to determine whether or not the duty cycle signal is within a spectral range and to eliminate noise.

3. The circuit according to claim 1, wherein the filter feedback circuit includes a feedback filter used for filtering high-frequency components out of the error signal to generate the error control quantity through linear computation.

4. The circuit according to claim 1, wherein the circuit further includes a sequential control circuit, wherein:

the sequential control circuit is used for controlling a whole working process of the signal duty cycle adaptive-adjustment circuit for a receiving terminal; the signal duty cycle adaptive-adjustment circuit carries out adaptive-adjustment in a preamble sequence time window of a USB PD message packet, namely, during duty cycle adaptive-adjustment, the first path switch (sw-m) is turned on, and the second path switch (sw-n) is turned off; and after adjustment is completed by the signal duty cycle adaptive-adjustment circuit, the first path switch (sw-m) is turned off, and the second path switch (sw-n) is turned on.

5. The circuit according to claim 1, wherein the circuit further includes a received signal activity indicating circuit, wherein:
the received signal activity indicating circuit is used for detecting the input signal; and if an input signal with valid features is detected, the sequential control circuit and a receiving system are enabled, and a receiving circuit starts to work.

6. The circuit according to claim 1, wherein a duty cycle of the duty cycle signal passing through the second path switch (SW-N) ranges from 35% to 65%, and an allowable deviation is +/−5%.

7. A signal duty cycle adaptive-adjustment method for a receiving terminal, characterized by including:
Step 602, turning off a first path switch (SW-M), and turning off a second path switch (SW-N);
Step 603, detecting, by a received signal activity indicating circuit, whether or not a valid input signal is input; if not, returning to Step 602;
Step 604, turning on the first path switch (SW-M), turning off the second path switch (SW-N), and initializing a number of times Nstep to 1;
Step 605, extracting and estimating a duty cycle parameter to obtain a duty cycle deviation, and obtaining an error signal through error computation;
Step 606, inputting the error signal to a filter feedback circuit, adjusting an output voltage of a digital-to-analog conversion circuit to generate a reference voltage, outputting, by an analog level comparison circuit, a subsequent waveform under a new reference voltage, and increasing the number of times Nstep by 1;
Step 607, judging whether or not the number of times Nstep is equal to 8 or a waveform duty cycle is close to an expected value, namely judging whether or not an output duty cycle error signal is smaller than a preset threshold; if the condition is not met, returning to Step 605;
Step 608, turning off the first path switch (SW-M), and turning on the second path switch (SW-N); and
Step 609, inputting an adjusted signal to a decoding circuit, and starting to receive and process subsequent valid data; and after a process is completed, returning to Step 603.

* * * * *